(12) United States Patent
Huet et al.

(10) Patent No.: US 9,318,527 B2
(45) Date of Patent: Apr. 19, 2016

(54) METHOD FOR PRODUCING PHOTOSENSITIVE INFRARED DETECTORS

(71) Applicant: COMMISSARIAT A L'ENERGIE ATOMIQUE ET AUX ENE ALT, Paris (FR)

(72) Inventors: Stephanie Huet, Grenoble (FR); Abdenacer Ait-Mani, Saint Egreve (FR); Lea Di Cioccio, Saint Ismier (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/399,824

(22) PCT Filed: May 6, 2013

(86) PCT No.: PCT/EP2013/059421
§ 371 (c)(1),
(2) Date: Nov. 7, 2014

(87) PCT Pub. No.: WO2013/167553
PCT Pub. Date: Nov. 14, 2013

(65) Prior Publication Data
US 2015/0102447 A1  Apr. 16, 2015

(30) Foreign Application Priority Data
May 9, 2012 (FR) ..................... 12 01324

(51) Int. Cl.
*H01L 27/146* (2006.01)
*H01L 23/00* (2006.01)

(52) U.S. Cl.
CPC ............ *H01L 27/1469* (2013.01); *H01L 24/03* (2013.01); *H01L 24/19* (2013.01);
(Continued)

(58) Field of Classification Search
None
See application file for complete search history.

(56) References Cited

U.S. PATENT DOCUMENTS

| 5,353,498 A | 10/1994 | Fillion et al. |
| 5,455,202 A | 10/1995 | Malloy et al. |

(Continued)

FOREIGN PATENT DOCUMENTS

| EP | 0 611 129 A2 | 8/1994 |
| EP | 0 977 252 A1 | 2/2000 |

(Continued)

OTHER PUBLICATIONS

International Search Report issued Jul. 26, 2013, in PCT/EP2013/059421, filed May 6, 2013.

(Continued)

*Primary Examiner* — Seahvosh Nikmanesh
(74) *Attorney, Agent, or Firm* — Oblon, McClelland, Maier & Neustadt, L.L.P.

(57) ABSTRACT

A method for producing at least one photosensitive infrared detector by assembling a first electronic component including plural photodiodes sensitive to infrared radiation and a second electronic component including at least one electronic circuit for reading the plurality of photodiodes, an infrared detector, and an assembly for producing such a detector, the method including: production, on each one of the first and second components, of a connection face formed at least partially by a silicon oxide (SiO2)-based layer; bonding the first component and the second component by the connection faces thereof, thus performing the direct bonding of the two components. The method can simplify hybridization of heterogeneous components for producing an infrared detector.

29 Claims, 5 Drawing Sheets

(52) U.S. Cl.
CPC ........... *H01L 24/80* (2013.01); *H01L 27/1465* (2013.01); *H01L 27/14687* (2013.01); *H01L 27/14692* (2013.01); *H01L 24/05* (2013.01); *H01L 24/08* (2013.01); *H01L 27/14632* (2013.01); *H01L 27/14636* (2013.01); *H01L 2224/03845* (2013.01); *H01L 2224/04105* (2013.01); *H01L 2224/05571* (2013.01); *H01L 2224/05647* (2013.01); *H01L 2224/08147* (2013.01); *H01L 2224/19* (2013.01); *H01L 2224/221* (2013.01); *H01L 2224/80201* (2013.01); *H01L 2224/80357* (2013.01); *H01L 2224/80895* (2013.01); *H01L 2224/80896* (2013.01); *H01L 2224/80948* (2013.01); *H01L 2224/96* (2013.01); *H01L 2924/00014* (2013.01); *H01L 2924/12036* (2013.01); *H01L 2924/12043* (2013.01)

(56) References Cited

U.S. PATENT DOCUMENTS

| | | | |
|---|---|---|---|
| 5,497,033 | A | 3/1996 | Fillion et al. |
| 6,204,079 | B1 | 3/2001 | Aspar et al. |
| 8,647,983 | B2 * | 2/2014 | Di Cioccio ........ B81C 1/00269 438/118 |
| 2003/0113947 | A1 | 6/2003 | Vandentop et al. |
| 2004/0157407 | A1 | 8/2004 | Tong et al. |
| 2005/0139828 | A1 | 6/2005 | Maruyama et al. |
| 2005/0161795 | A1 | 7/2005 | Tong et al. |
| 2006/0258120 | A1 | 11/2006 | Gilroy et al. |
| 2006/0281215 | A1 | 12/2006 | Maruyama et al. |
| 2007/0164384 | A1 | 7/2007 | Maruyama et al. |
| 2007/0232023 | A1 | 10/2007 | Tong et al. |
| 2008/0135965 | A1 | 6/2008 | Gilroy et al. |
| 2008/0146071 | A1 | 6/2008 | Davoine et al. |
| 2009/0311820 | A1 | 12/2009 | Maruyama et al. |
| 2009/0315134 | A1 | 12/2009 | Maruyama et al. |
| 2009/0317932 | A1 | 12/2009 | Maruyama et al. |
| 2010/0032785 | A1 | 2/2010 | Maruyama et al. |
| 2010/0238334 | A1 | 9/2010 | Takahashi |
| 2010/0248399 | A1 | 9/2010 | Hsieh |
| 2011/0031401 | A1 | 2/2011 | Mitra et al. |
| 2011/0041329 | A1 | 2/2011 | Tong et al. |
| 2011/0233609 | A1 | 9/2011 | Cordat et al. |
| 2011/0250717 | A1 | 10/2011 | Maruyama et al. |
| 2011/0269258 | A1 | 11/2011 | Maruyama et al. |
| 2012/0135559 | A1 | 5/2012 | Maruyama et al. |

FOREIGN PATENT DOCUMENTS

| | | |
|---|---|---|
| EP | 2 230 690 A2 | 9/2010 |
| FR | 2 949 903 A1 | 3/2011 |
| WO | 94/17550 A1 | 8/1994 |
| WO | 2012/010662 A2 | 1/2012 |

OTHER PUBLICATIONS

French Preliminary Search Report issued Feb. 25, 2013, in Patent Application No. FR 1201324, filed May 9, 2012 (with English Translation of Category of Cited Documents).

Q.-Y. Tong, "Room temperature metal direct bonding", Applied Physics Letters, vol. 89, No. 18, XP 012086707, Oct. 30, 2006, 3 pages.

Grzegorz W. Deptuch, et al., "Vertically Integrated Circuits at Fermilab", IEEE Transactions on Nuclear Science, vol. 57, No. 4, XP 011312353, Aug. 16, 2010, pp. 2178-2186.

J. Beck, et al., "The HgCdTe Electron Avalanche Photodiode", IEEE LEOS Newsletter, Oct. 2006, pp. 8-12.

E. Jalaguier, et al., "Transfer of 3 in GaAs film on silicon substrate by proton implantation process", Electronics Letters, vol. 34, Issue 4, Feb. 19, 1998. pp. 408-409.

D. F. Gibbons, "Thermal Expansion of Some Crystals with the Diamond Structure", Physical Review, vol. 112, No. 1, Oct. 1, 1958, pp. 136-140.

* cited by examiner

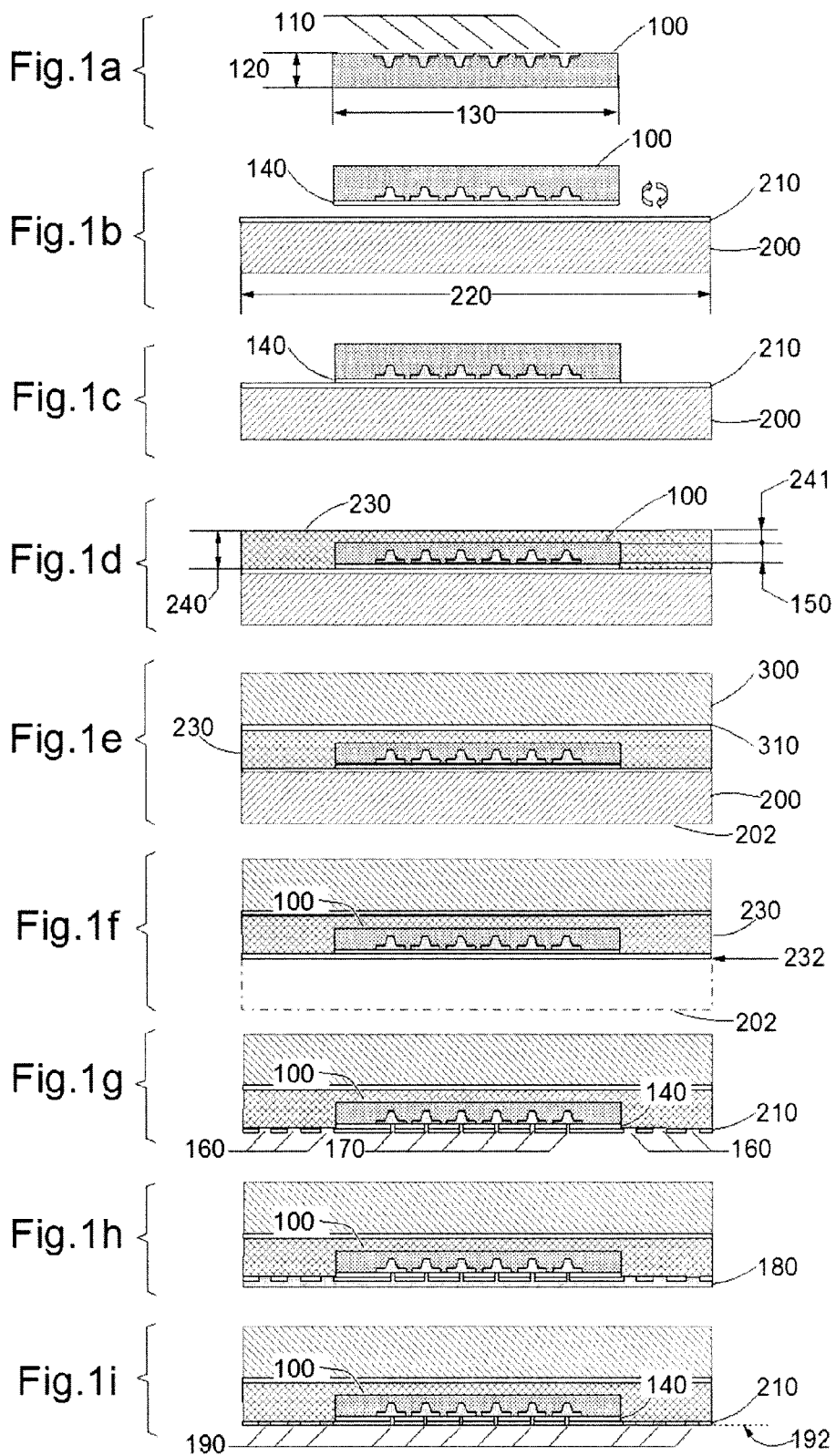

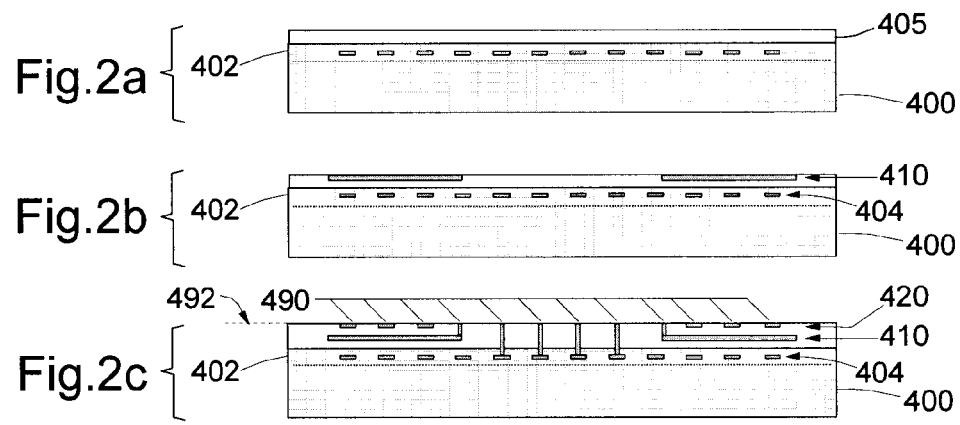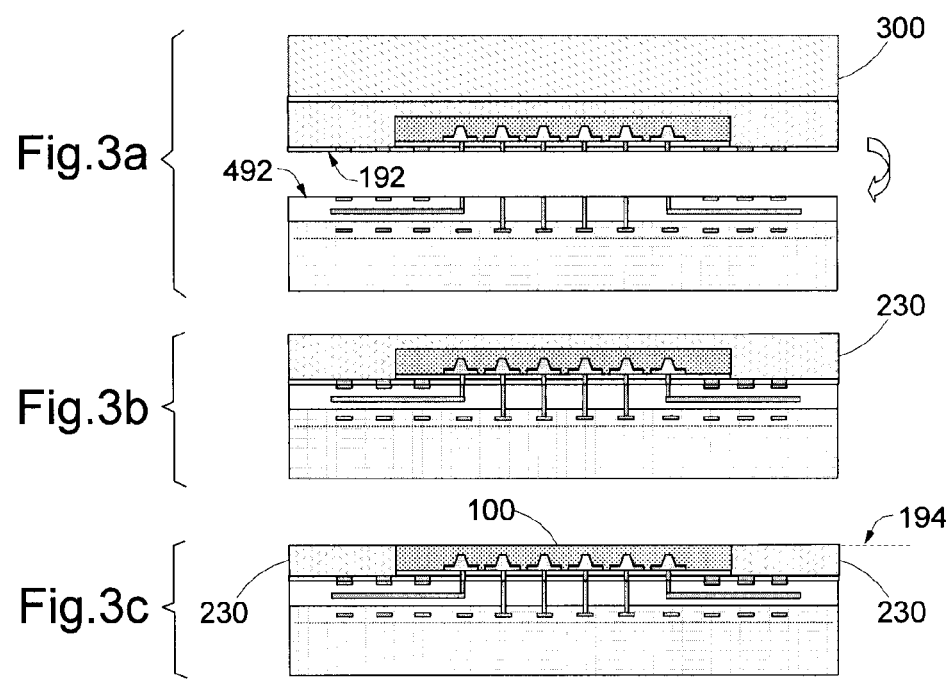

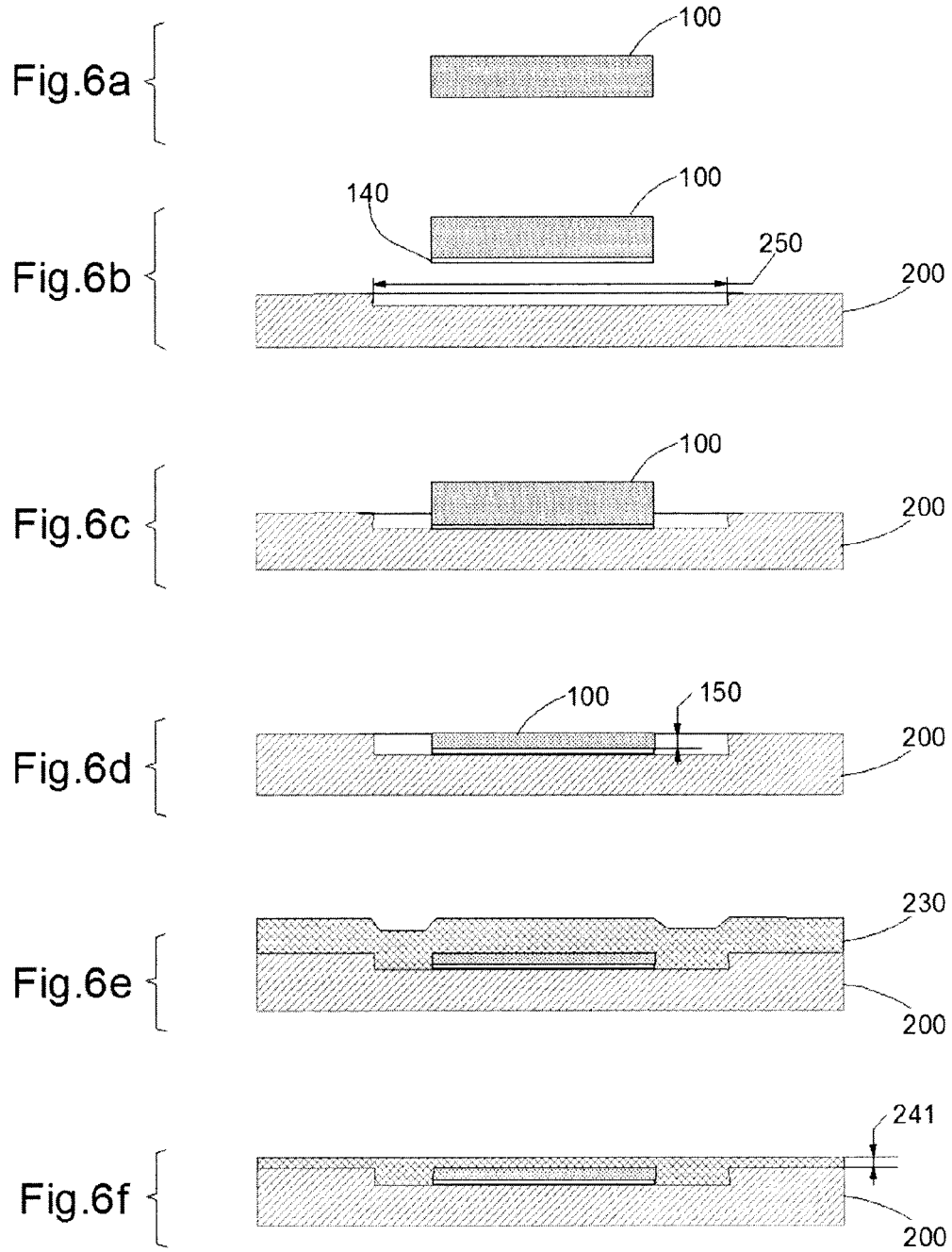

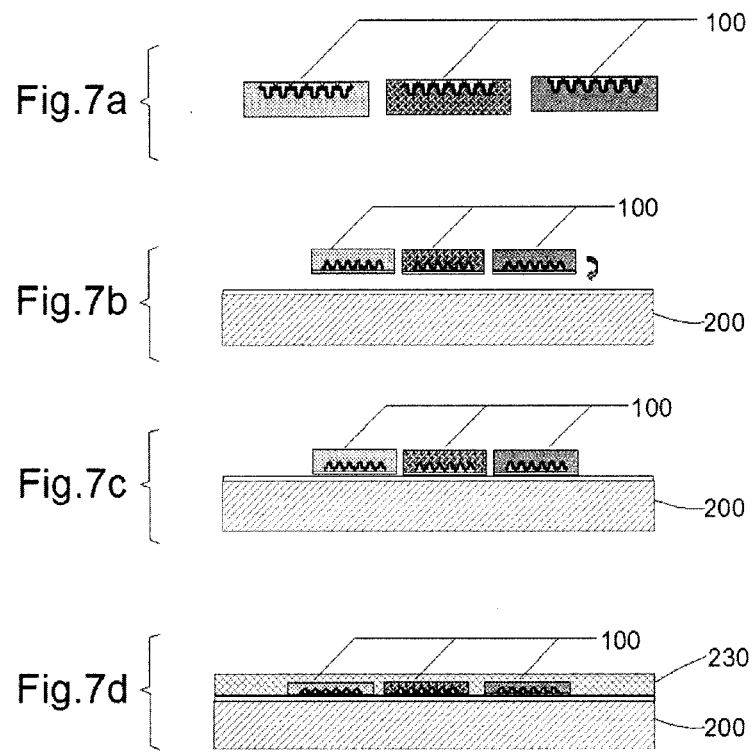
Fig. 7a
Fig. 7b
Fig. 7c
Fig. 7d
PRIOR ART
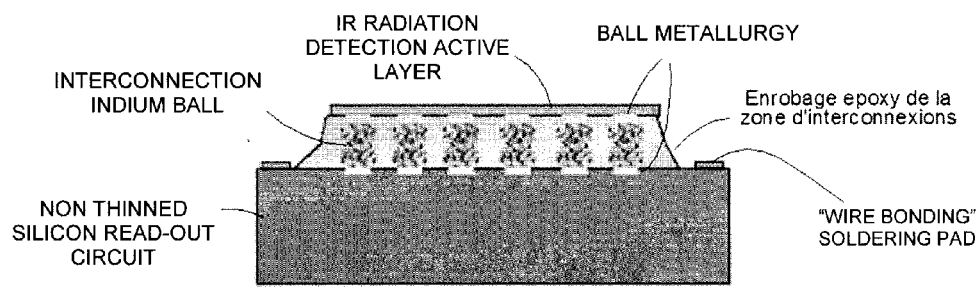
Fig. 8

METHOD FOR PRODUCING PHOTOSENSITIVE INFRARED DETECTORS

TECHNICAL FIELD OF THE INVENTION

The present invention relates to infrared detectors in general. It is particularly advantageous for photosensitive infrared detectors using quantum detection materials that must be operated at cryogenic temperatures to reduce their thermal noise.

STATE OF THE ART

Infrared detectors are present in many industrial and scientific applications, such as infrared spectroscopy, wherein it is desired to analyze the electromagnetic spectrum of physical phenomena in a range of wavelengths well beyond visible, i.e. for wavelengths that are measured in micrometers (1 micron or $\mu m=10^{-6}$ meter) or tens of microns.

Producing high-performance infrared detectors is known, in the form of photodiodes which operate by absorption of infrared photons and which use quantum detection materials of the composite semiconductor type, for example the so-called III-V or II-VI materials, i.e. semiconductor materials the constituents of which belong, respectively, to columns III and V and columns II and VI of the Periodic Table of elements. As this type of detector is, however, also inherently sensitive to background noise (phonons) from the crystalline network of the material which it is made of, then it should be cooled to cryogenic temperatures, typically at the temperature of liquid nitrogen (77° K), in order to increase the detection sensitivity of the infrared radiation.

Furthermore it must be possible to associate with the photodiodes made on a detector substrate, circuits reading out the current generated by the detection of infrared radiation. Read-out circuits are typically electronic circuits of the integrated circuits type based primarily on the use of silicon as a semiconductor material.

The production of efficient infrared detectors thus requires being able to combine, in the same device, components using different technologies: composite semiconductors for the detection of infrared radiation on the one hand, and silicon for read-out circuits on the other hand. Chip hybridization using materials of very different nature necessarily raises problems. In particular, the requirement of operating the infrared detectors at very low temperatures raises the problem of the different expansion of chips between the room temperature and the operation temperature of the device. This problem is aggravated by the fact that the coefficient of thermal expansion or CTE of silicon, and that of the composite semiconductor materials used for infrared detection are significantly different: about 2.5 to 3.5 ppm/° C. (dimensional variation in parts per million and per degree) for silicon and in a range of 5 to 7 ppm/° C. for the composite semiconductors.

A current technique of hybridization of the infrared radiation detection chip and of the read-out circuits is based on the use of indium balls. The method is described for example in the French patent applications FR2938973 and FR2949903. It consists in depositing balls of pure indium so that each photodiode of the infrared radiation detector circuit is connected to one indium ball. Pure indium balls are also deposited on the contact areas of the read-out circuit according to a matrix which is the mirror of that of the photodiodes. The two matrices are then assembled by soldering using the "flip chip" technique. The assembly is then heated to a temperature greater than or equal to the melting temperature of indium to cause melting of the balls. The balls create a mechanical and electrical connection between the connection pads of both chips. The rise in temperature required for melting may damage the hybridized components.

A schematic diagram of the technique is illustrated in FIG. 8. The quality of soldering is enhanced by the deposition of a deoxidizing flux on the ball matrix. The soldering flux makes it possible to eliminate the native oxide layer from the surface of indium. Among the difficulties in implementing this technique the step of cleaning which follows the soldering should be mentioned, wherein the passage of a cleaning liquid must be forced so as to drain all the flux residues in an area containing a lot of connections. This step of cleaning is all the more difficult to execute since the repetition pitch of the balls is low. One of the major drawbacks of this step of cleaning is that a large amount of liquid must be used to be sure that it penetrates well into the connection area. This step is long and costly. Besides, the products contained in the cleaning liquid are aggressive and corrosive. Using a large amount of liquid entails a significant risk of degradation of the interconnection balls.

The encapsulation of the connections area also creates difficulties. It is generally carried out using an encapsulation material such as epoxy glue. The overflow of the encapsulation liquid on the side edges creates a residual bead which causes stresses on the hybridized component, thereby degrading the electric functions thereof and causes cleavages, i.e., cracks, which may cause the cracking of the hybridized components.

The present invention therefore aims at providing a method for making infrared detector which remedies at least some of the difficulties described above.

Other objects, characteristics and advantages of this invention will become apparent upon examining the following description and the appended drawings. It is understood that other advantages may be included.

SUMMARY OF THE INVENTION

According to one embodiment, the present invention relates to a method for producing at least one photosensitive infrared detector by assembling a first electronic component comprising a plurality of photodiodes sensitive to infrared radiation and a second electronic component comprising at least one electronic read-out circuit of the plurality of photodiodes. The method comprises:
  the production, on each one of the first and second components, of a connection face formed at least partially by a silicon oxide SiOx-based layer, with x ranged between 1 and 2;
  A step of bonding the first component and the second component by the connection faces thereof, thereby performing the direct bonding of the two components.

Producing connection faces preferably comprises, for each one of the first and second components:
  the vacuum deposition of a silicon oxide SiOx-based layer, with x ranged between 1 and 2;
  a chemical mechanical polishing (CMP) of the deposited layer, with the chemical mechanical polishing (CMP) being performed so as to bring the root mean square height (RMS) to a value lower than or equal to 1 nanometer.

When developing the present invention, it has been discovered that the direct bonding between a component comprising the photodiodes and a read-out component by contacting the faces coated at least partially with a silicon oxide-based material gives very good results. Given the different nature of both components, the correct consistency of the assembly after bonding has a surprising effect, all the more so since the correct consistency is preserved even when the detector operates at very low operating temperatures. The invention thus makes it possible to significantly simplify the production of an infrared detector with respect to the currently known techniques.

Within the scope of the present invention and like in the prior art, the direct bonding of two components means that the bonding is obtained thanks to the chemical bonds which are created between the two surfaces in contact. Both surfaces have sufficiently low roughness for the Van der Waals forces to be able to provide a solid holding of the two components, preferably by themselves.

The direct bonding thus requires no intermediate bonding layer. Besides, it is achieved without requiring the application of a significant pressure.

In addition, the invention makes it possible to use highly conductive materials such as copper with no oxide on the surface. The invention also makes it possible to eliminate the constraints entailed in soldering. It also enables short connections.

Within the scope of the present invention, the term 'component' designating the first and the second components may be replaced by the term 'chip' or by the term 'electronic circuit'. The first component may thus be referred to as a 'detector circuit or 'detector chip'. The second component may also be referred to as a 'read-out circuit' or 'read-out chip'.

The silicon oxide-based layer forming each connection face may thus be a layer of SiO, SiO2, or any silicon oxide SiOx with the ratio x ranged between 1 and 2, for example 1.2, 1.5, 1.8. A layer of SiON, SiOH, SiOC, SiOCH, SiONH may also be suitable.

This layer is thus advantageously electrically insulating and transparent to the infrared wavelengths. It is compatible with the semiconductor technologies and reveals a good mechanical and chemical behaviour under the temperature conditions imparted by the photoconductive material.

Optionally, the method according to the invention further comprises at least any one of the following characteristics and steps and:

Advantageously, producing the connection faces comprises a chemical mechanical polishing (CMP) executed so as to bring the root mean square height (RMS) to a value lower than or equal to 10 Å or 1 nanometer (nm), and preferably lower than or equal to 5 Å or 0.5 nanometer (nm).

Advantageously, the step of bonding comprises the application of a bonding wave.

Advantageously, the bonding wave comprises the application of one or more localized pressure points. Advantageously, the application of the bonding wave comprises applying one or more localized pressure points on a surface smaller than a few square millimeters, typically a surface smaller than 10 mm$^2$, or even a surface smaller than 5 mm$^2$, or even a surface smaller than a few tens or hundreds of μm$^2$.

Advantageously, the step of bonding comprises the contacting of the connection faces at room temperature.

Advantageously, the step of bonding comprises the contacting of the connection faces with no pressure being exerted on the whole surface of one or the other of the first and the second components. More generally, no pressure above 500 kN is exerted on the whole surface of one or the other of the first and the second components.

Advantageously, the direct bonding of the two components is provided, preferably entirely, by Van der Waals forces, over all the opposite surfaces.

Advantageously, the vacuum deposition provides layers of high density, which, after chemical mechanical polishing (CMP) to achieve a very low roughness, typically a root mean square height (RMS) with a lower value or equal to 1 nanometer. The vacuum deposition to produce a connection face for the first and/or the second component is preferably carried out by any one of the following: physical vapor deposition (PVD), chemical vapor deposition (CVD), preferably plasma enhanced chemical vapor deposition (PECVD), Advantageously, the vacuum deposition is performed at a temperature below 300° C.

Preferably producing a connection face on the first component and a connection face on the second component comprises forming on such connection faces, copper (Cu) inlay zones embedded in these faces, and so arranged as to match when such connection faces are positioned opposite each other. For at least one of the connection faces, the copper inlay areas occupy a surface area between 18% and 40% of the surface of the connection face. Preferably, the copper inlay areas occupy a surface area between 18% and 40% of the surface of each one of the connection faces. Even more preferably, this surface is between 15% and 30%.

Preferably producing the connection face of the first component is performed so that the silicon oxide-based layer (SiOx) covers the entirety of such connection face except for the copper inlay areas and tracks and/or electric interconnection vias.

The copper areas, also called "dummies", are turned toward the outside of each of the connection faces. They are so arranged on the surface of each one of the connection faces as to overlap when the connection faces are opposite each other. They are in contact when the connection faces are in contact. Such copper areas have no electric function. They are not connected to interconnections or components such as photodiodes, for instance. In this regard, they clearly differ from the electric interconnections provided in the bonding layers. They each occupy a significantly larger surface than a line or an electric interconnection via. Such copper areas make it possible to significantly reinforce the attachment of the first and the second components since the Cu—Cu covalent bonds are stronger than the oxide-oxide covalent bonds.

Each one of two components comprises, on its face intended to be in contact with the face of the other component, the silicon oxide-based layer and interconnection tracks.

Preferably the direct bonding annealing is carried out at a temperature below 300° C. Advantageously, this temperature makes it possible to prevent the diffusion of dopant species into the photodiodes.

Advantageously, a step of thinning the first component is executed so that the thickness thereof is lower than about 35 times or more the thickness of the second component and preferably so that the thickness thereof is between and 8 μm and 20 μm and the thickness of the second component between 725 μm and 1,000 μm.

Advantageously, this thinning enables the first component to undergo without damage the dimensional changes in the second component. The risks of cleavage or breaking are thus significantly reduced even when the detector is operating at very low temperatures.

Advantageously, the step of thinning is performed after the step of direct bonding.

Preferably, at least one of the components forms an assembly of layers, with such assembly comprising a connection face formed at least partially of the silicon oxide-based layer.

According to one advantageous embodiment, the method comprises, prior to producing a connection face on the first component, a step of preparing the first component. The step of preparing the first component comprises: producing at least one base substrate integrating or intended to integrate the plurality of photodiodes; encapsulating the base substrate in an encapsulation layer, with the encapsulation being performed so that the main dimension of the first component comprising the base substrate and the encapsulation layer is greater than the main dimension of the base substrate.

The main dimensions are the maximum dimensions taken along directions contained in planes parallel to the connection faces. The encapsulation is preferably performed so that the encapsulation layer completely covers the base substrate except for one face of the base substrate intended to be placed opposite the second component.

The invention thus makes it possible to produce photosensitive detectors using components having sizes that can easily be adapted to the standard equipment of the microelectronics industry.

The first component comprising the base substrate and the encapsulation layer thus forms a plate having two opposite flat faces. It may be called a "wafer" or a "slice". The invention is not restricted to a specifically shaped perimeter defined by the plate. In particular, this plate may have a circular, hexagonal, rectangular, square or any other shape.

Within the scope of the present invention, the main dimension of a component is the maximum dimension of the component taken along a direction contained in the plane of one of the faces of the component. Typically, when the component forms a disc-shaped plate, the main dimension is the diameter of the disc. When the component forms a rectangle-shaped plate, the main dimension is the diagonal of the rectangle.

Preferably, the first component comprising the base substrate encapsulated in the encapsulation layer has a standard dimension in the microelectronics industry. Typically it forms a disk with a diameter of 100, 200, 300 or 450 mm.

Preferably, the first and the second components form plates and a diameter or a diagonal of the first component is: greater than the diameter or the diagonal of the base substrate and approximately equal to the diameter or the diagonal of the second component.

Preferably, the second component also has a plate shape. Advantageously, the peripheries of the first and the second components are identical. They have the same shape and the same size, or not. As a matter of fact, a square substrate can be integrated in a round wafer.

Advantageously, the encapsulation layer is a silicon oxide $SiO_x$-based layer with x ranged between 1 and 2. Such layer may thus be a layer of SiO, SiO2, or any silicon oxide SiOx with the ratio x ranged between 1 and 2, for example 1.2, 1.5, 1.8. A layer of SiON, SiOH, SiOC, SiOCH, SiONH may also be suitable.

This layer is thus advantageously electrically insulating and transparent to the infrared wavelengths. It is compatible with the semiconductor technologies and reveals a good mechanical and chemical behaviour at the temperatures imparted by the photoconductive material.

Preferably, the base substrate has a coefficient of thermal expansion (CTE) between 4 and 8 ppm/° C. and preferably between 5 and 7 ppm/° C. Such substrate is for example made of InSb. Preferably the second component comprises a substrate carrying the electronic read-out circuit and having a thermal expansion coefficient (CTE) between 1.5 and 4 ppm/° C. and preferably between 2.5 and 3.5 ppm/° C. The difference in the coefficients of thermal expansion of the two components makes the good consistency of the assembly produced by the invention even more surprising. The difference in CTE of each component is compensated by the fact that the initial connection is provided at room temperature and that the detector has been thinned. The detector material, i.e. the one of the first component follows the displacement of the material of the substrate carrying the read-out circuit which is more solid.

Preferably, prior to the encapsulation of the at least one base substrate in the encapsulation layer, a step of fixing the base substrate on a handling substrate is executed by a direct or an organic bonding.

Advantageously, prior to the step of fixing the base substrate to a handling substrate a step of producing a bonding layer on at least a portion of one face of the base substrate and a bonding layer is executed on at least a portion of a face of the handling substrate. This bonding layer may be a native oxide or an oxide deposited using a PVD or PECVD method. The step of fixing the base substrate to the handling substrate is achieved by direct bonding of the bonding layers thereof. Advantageously, the bonding layers are silicon oxide SiOx-based layers with x ranged between 1 and 2. Such layer may thus be a layer of SiO, SiO2, or any silicon oxide SiOx with the ratio x ranged between 1 and 2, for example 1.2, 1.5, 1.8. A layer of SiON, SiOH, SiOC, SiOCH, SiONH may also be suitable.

According to a first embodiment, the bonding layer of the base substrate is positioned on a face opposite the connection face of the first component. According to an alternative embodiment, the bonding layer of the base substrate is positioned on a face opposite the connection face of the first component.

According to another embodiment, the handling substrate has a receiving housing and the at least one base substrate is fixed in the receiving housing during the step of fixing.

According to a first embodiment, the plurality of photodiodes is integrated into the base substrate prior to the encapsulation of the base substrate in the encapsulation layer.

Preferably, after fixing the base substrate on the handling substrate and after encapsulation, a free face of the encapsulation layer is fixed to a handle substrate, then the handling substrate is at least partially removed. The free surface of the encapsulation layer is a face not having the base substrate. Typically, the first component, after encapsulation, has a first face formed by the encapsulation layer and the base substrate. The first face is then fixed to the handling substrate. The first component also comprises a second face formed only by the encapsulation layer. This second face is fixed to the handle substrate.

Advantageously, fixing the first component on the handling substrate is carried out by the connection face of the first substrate and removing the handling substrate is performed such that the first component maintains an oxide silicon-based layer deposited on the base substrate prior to its being fixed to the handling substrate, and preferably maintains a silicon oxide-based layer provided by the handling substrate for the step of fixing.

Preferably, prior to the step of fixing the encapsulation layer on the handle substrate, a step of producing a fixing layer on at least a portion of a face of the handle substrate is performed, and the step of fixing the encapsulation layer on the handle substrate is performed by direct bonding of the fixing layer of the handle substrate on a free-remaining face of the encapsulation layer.

According to an advantageous alternative solution, the first component comprises a plurality of base substrates and the step of preparing the first component comprises encapsulating the plurality of base substrates in the same encapsulation layer. Preferably, each individual base substrate is composed of a plurality of chips with a network of integrated photodiodes tested beforehand to integrate detector slices with the better yields only.

According to a second embodiment, the plurality of photodiodes is integrated into the base substrate after the encapsulation of the base substrate in the encapsulation layer.

Advantageously, the encapsulation of the base substrate is performed so that the encapsulation layer covers at least one face of the base substrate. At least one access to the face of the base substrate is then provided through the encapsulation layer which is coated with the encapsulation layer and the photodiodes are executed by ion implantation of dopants through said at least one access. Preferably, the second component comprises a number of read-out circuits equal to the number of photodiodes. It is a matrix of read-out pixels which reads a photodiodes pixel matrix.

Advantageously, at least one space is created between the periphery of the base substrate and the encapsulation layer. Advantageously, this space enables the base substrate to deform under the effect of temperature changes independently of the deformations of the second component, thus reducing the mechanical stresses and the risks of breaking or cleavage. Preferably, this space extends over the entire periphery of the base substrate. This space thus forms a trench between the encapsulation layer and the base substrate. It is obtained either by removing the material forming the base substrate or preferably by removing the material forming the encapsulation layer.

According to one embodiment, the step of bonding the first component and the second component forms a plurality of photosensitive infrared detectors which comprise each at least one photodiode and a read-out circuit, and a step of cutting is performed after the step of bonding for separating the photosensitive infrared detectors from one another.

According to another embodiment, the invention discloses a method for producing at least one photosensitive detector by assembling a first electronic component having a plurality of photodiodes and a second electronic component comprising at least one electronic read-out circuit of the plurality of photodiodes, with the method comprising, prior to the assembling, a step of preparing a first component comprising:

The production of at least one base substrate integrating or intended to integrate the plurality of photodiodes, The encapsulation of the base substrate in an encapsulation layer, so that the main dimension of the first component comprising the base substrate and the encapsulation layer is greater than the main dimension of the base substrate.

Preferably, the encapsulation layer encapsulates the base substrate so as to completely cover the base substrate except for one face of the base substrate intended to be placed opposite the second component.

The first component and the second component are assembled during a subsequent step. This method for preparing the first component may be combined with all the steps described above. The invention thus makes it possible to produce photosensitive detectors using the standard equipment of the microelectronics industry.

Preferably, the diameter of the base substrate is smaller than the diameter of the second component and the diameter of the first component is approximately equal to the diameter of the second component.

Preferably, each component has a plate shape.

Preferably the photodiodes are sensitive to infrared radiation and the detector is an infrared photosensitive detector.

According to another embodiment, the present invention relates to a photosensitive detector, preferably an infrared detector comprising a first electronic component comprising a plurality of photodiodes sensitive to infrared radiation and a second electronic component comprising at least one electronic read-out circuit of the first component. The first and the second components each have a connection face and are bonded directly to one another by their connection faces, with each one of the connection faces being formed at least partially by a silicon oxide SiOx-based layer with x ranged between 1 and 2.

Preferably the first component comprises: at least one base substrate comprising the plurality of photodiodes and an encapsulation layer. The encapsulation layer encapsulates the base substrate so as to completely cover the base substrate except for one face of the base substrate intended to be placed opposite the second component.

Preferably but not restrictively, each one of the connection faces also carries copper (Cu) inlay areas so arranged as to match the copper inlay areas carried by the other connection face, with the copper inlay areas of each connection face occupying a surface area between 18% and 40% of each connection face.

According to another embodiment, the invention relates to an assembly for producing a photosensitive detector, preferably an infrared detector. Thus, the assembly is an assembly of components used in the composition of a photosensitive detector. The assembly comprises at least a first electronic component comprising a plurality of photodiodes preferably sensitive to infrared radiation and at least a second electronic component comprising at least one electronic read-out circuit. The first and the second components each have a connection face formed at least partially by a silicon oxide SiOx-based layer, with x ranged between 1 and 2;

Preferably the first component comprises: at least one base substrate comprising the plurality of photodiodes and an encapsulation layer. The encapsulation layer encapsulates the base substrate so as to completely cover the base substrate except for one face of the base substrate intended to be placed opposite the second component.

Preferably but not restrictively, each one of the connection faces comprises copper (Cu) inlay areas so arranged as to match the copper inlay areas carried by the other connection face, with the copper inlay areas of each connection face occupying a surface between 18% and 40% of the surface of such face.

BRIEF DESCRIPTION OF THE FIGURES

The goals and objectives as well as the characteristics and advantages of the invention will emerge better from the detailed description of an embodiment of this latter, illustrated by the following accompanying drawings in which:

FIGS. 1a to 1i describe the steps of an exemplary method according to the invention wherein a first electronic component comprising the photodiodes sensitive to infrared radiation is formed and said first component is assembled on a "handle" substrate to form an assembly which can be handled in a standard microelectronic production line.

FIGS. 2a-2c disclose the preparation of a second electronic component containing the photodiodes read-out circuits.

FIGS. 3a to 3c describe the steps of assembling the two electronic components, the one containing the photodiodes and the one containing the read-out circuits, by direct bonding.

FIGS. 6a to 6f illustrate another exemplary production of the detection component, an example wherein a housing is provided in the handling substrate for receiving the base substrate.

FIGS. 7a to 7d illustrate another exemplary embodiment of the invention, wherein several base substrates are provided, with each having infrared radiation detectors that are assembled on the same handling substrate to form an electronic detection component.

FIG. 8 illustrates an example according to the prior art.

Figure 4A:
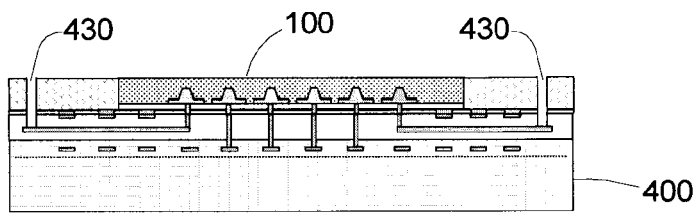
FIGS. 4a and 4b illustrate examples of further steps of the method according to the invention which can be performed after the two components have been assembled.

The drawings attached are given as examples and are not limiting to the invention.

In addition, the drawings in the figures are schematic representations and are not necessarily to scale with a practical application. More particularly, the relative thickness of the various layers and substrates are not a representation of reality.

DETAILED DESCRIPTION OF THE INVENTION

It should be noted that, within the scope of the present invention, the words "on", "over" or "underlying" or the equivalents thereof do not necessarily mean "in contact with". Thus, for instance, depositing a first layer on a second layer does not necessarily mean that the two layers are directly in contact with each other, but this means that the first layer at least partially covers the second layer by being either directly in contact therewith or by being separated therefrom by another layer or another element.

Within the scope of the present invention, the term "silicon oxide-based" means "includes a silicon oxide optionally combined with at least another element". Advantageously, the at least another element makes it possible, for example, to form a layer made of one of: SiON, SiOH, SiOC, SiOCH and SiONH.

FIGS. 1a to 1i describe the steps of the method wherein a detection component comprising the infrared radiation (IR) detector circuits is produced and this first component 100, 230 is assembled on a "handle" substrate 300 to form an assembly which can be handled in a standard production line as those implemented by the microelectronics industry. These more particularly relate to lines used for the production of integrated circuits, typically electronic circuits of the CMOS type, the acronym for "complementary metal-oxide-semiconductor", i.e. electronic circuits based on complementary transistors of the metal-oxide-semiconductor type.

The component comprising the detector circuit may also be referred to as the first component 100, 230, or the detection chip or the detection chip circuit. It particularly includes a base substrate 100 integrating the photodiodes 110. As will be described in details below with reference to a non-restrictive but advantageous embodiment, the component comprising the detector circuit may also include a layer 230 encapsulating the base substrate 100. It also comprises electric tracks and advantageously but not restrictively dummy copper areas often referred to as "dummies". It further comprises at least one silicon oxide-based 140, 210, preferably silicon dioxide-based layer, on one of its faces, also called the connection face and the function of which as relates to bonding will also be described in details hereafter.

To produce the photodiodes 110 in a base substrate 100, or infrared detector circuits, a quantum detection material is used, which may be made of one of various composite semiconductors used by the microelectronics industry. These may for example be composite semiconductor called IV-VI materials the elements of which come from columns IV and VI of the Periodic Table of elements. This may for example be a ternary alloy such as PbSnTe and a binary alloy such as PbSe, i.e. respectively: lead-tin telluride and lead selenide. The composite semiconductor used for the base substrate 100 may also be a material known as III-V material such as the following materials: InSb, InP, GaAs, InAs, InGaAs, InGaSb and InAsSb, i.e. respectively: indium antimonide, indium phosphide, gallium arsenide, indium arsenide, gallium-arsenide indium, gallium antimonide and indium-arsenide, indium antimonide. It may also be made of so-called II-VI composite materials such as HgCdTe, i.e. mercury-cadmium telluride. In a preferred implementation of the invention, the material of the base substrate 100 uses indium antimonide (InSb) which is known for its high performance IR detection in the wavelength range of 3 to 5 μm.

More generally, the base substrate 100 of the detection component can be made of one of the following materials: III-V, II-VI, IV-IV (such as SiGe), IV-VI (such as PbSe).

Whatever the composite semiconductor material used, the substrates of this type are produced in dimensions that are smaller than those of the substrates used in the standard production lines of integrated circuits. To be able to assemble the two types of substrates, the size of the smaller ones must be adapted to that of the largest ones, as explained below. As indicated above, within the scope of the present invention, the main dimension of a component is the maximum dimension of the component taken along a direction contained in the plane of one of the two parallel faces of the component. The main dimensions are thus contained in planes parallel to the connection faces 192, 492. With reference to the illustrated figures, the main dimension is contained in a horizontal plane. The thickness of a layer or a substrate is taken in a vertical direction perpendicular to the main dimensions.

Typically, the dimension of the base substrate 100 is the diagonal or the diameter of its face intended to be placed opposite the second component 400; the dimension of the first component 100, 230 is the diagonal or the diameter of its face intended to be placed opposite the second component 400; the dimension of the second component 400 is the diagonal or the diameter of its face intended to be placed opposite the first component 100, 230.

FIG. 1a shows the photodiodes 110 constituting the infrared radiation detectors which are formed in the base substrate 100. The photodiodes can be PN doped junctions or comprise an intrinsic intermediate, i.e. non-doped area so as to form a so-called PIN diode. The photodiodes are conventionally produced by ion implantation of dopants. The base substrate 100 used for the detection typically has a thickness 120 from 700 to 1,000 μm. The base substrate 100 may have different shape factors in dimensions 130 ranging from two inches (1 inch=25.4 mm) to 125 millimeters.

As shown in FIG. 1b, prior to being assembled on a handling substrate 200, the base substrate 100 is first cleaned so as to remove the native oxide from the surface and improve the adhesion of the silicon oxide (SiO2) layer that will be deposited thereon for bonding to the handling substrate. A thin silicon oxide layer 140 is then deposited at a low temperature onto the InSb which is preferably the material the base substrate 100 is made of. The deposition is typically performed using a method known as PECVD ("plasma-enhanced chemical vapor deposition" and meaning chemical vapor deposition assisted by plasma) at a temperature below 300° C. In the case of the invention the plasma gas preferably consists of silane (SiH4) and nitrous oxide (N2O).

To avoid the risk of the doping species of the photodiodes spreading into the detector material, the invention provides to limit the temperature of the deposition operation to a value of less than 300° C. since the early stages of production of the photodiodes have been performed at temperatures which were themselves below this value. The other known deposition techniques, so-called PVD and CVD, the acronyms for "physical vapor deposition" and "chemical vapor deposition", i.e., respectively, physical or chemical vapor deposition may also be suitable provided the temperature constraint mentioned above can be complied with.

The surface oxide is then processed by chemical mechanical polishing, an operation usually known by its English acronym CMP for "chemical mechanical polishing". The purpose of this operation is to make the surface of the oxide plane. The chemical mechanical polishing technique used may be the one described in Chapter 14.2 of the book "Handbook of Cleaning for Semiconductor Manufacturing", 2011, Ed Wiley. To this end, a thickness of about 250 nm (1 nanometer=$10^{-9}$ m) of oxide is removed. The surface is then cleaned to clear it from the polishing residues (abrasive particles and polishing liquid generally known by their English name as "slurry"). A plane hydrophilic surface of oxide is thus obtained, with a low surface roughness. Roughness is quantified by a parameter called RMS, the abbreviation for "root mean square" which measures the root mean square height. Roughness is advantageously equivalent to or above 10 Å (1 Angstrom=$10^{-10}$ meter), or even 5 Å. The surface is free of particulate contamination in order to create the intermolecular bonds that produce the adhesion of the base substrate 100 on the handling substrate 200 as will be seen below.

Advantageously, the above-mentioned CVD and PVD, preferably PECVD techniques used for forming the silicon oxide layer 140 make it possible to obtain a particularly dense silicon oxide layer 140. These deposition techniques thus contribute to produce, after CMP, a surface condition the RMS surface roughness of which is less than or equal to 1 nm.

The handling substrate 200 is prepared separately. As the name suggests it is primarily used as a mechanical support. It has a greater size 220 which must be compatible with the production line of the electronic read-out circuits which will finally be assembled with the infrared radiation detectors of the base substrate 100.

The handling substrate 200 will also be coated with a thin silicon oxide-based layer 210. In this case, it may be an oxide produced by high temperature thermal growth, since the handling substrate does not contain any sensitive device. It may also be deposited as above by PECVD, CVD or PVD at low enough a temperature not to damage the photodiodes. As indicated above, these deposition techniques make it possible to produce a high density silicon oxide-based layer 210.

Advantageously, vacuum deposition makes it possible for the density of the deposited layer to be sufficient for a chemical mechanical polishing (CMP) of the deposited layer to be used to produce a root mean square height (RMS) of less than or equal to 1 nm.

The deposition thickness is typically 500 nm. As for the base substrate 100 containing the photodiodes, the oxide surface 210 of the handling substrate is polished. During this operation about 250 nm of SiO2 is removed. After cleaning a flat surface with a low roughness is produced. As above, roughness does not exceed 10 Å, even 5 Å and a surface free of particulate contamination will improve molecular adhesion.

It should be noted that in general the handling substrate 200 may be of a different size, of a different geometry, of a different thickness and made of a different material from that of the base substrate 100. As already mentioned above the handling substrate 200 is primarily used as a mechanical support for the base substrate 100 containing the photodiodes 110. The material which it is made of must be compatible with a subsequent step of mechanical grinding described in FIG. 1e. This step, which is generally referred to by the English term "grinding" will help to remove the handling substrate and allow the assembling of the substrate 100 containing the infrared radiation detectors with the one containing the read-out circuit. The material of the handling substrate 200 may be selected from the following materials: glass, silicon (Si), germanium (Ge) or sapphire. However a material will primarily be chosen if it has a coefficient of thermal expansion close to that of the base substrate 100 in order to prevent, during the annealing operation described below, which will create thermo-mechanical constraints, on the one hand, delamination of the bonding interface that may create cracks in the quantum detection material, secondly, a misalignment of the pads and/or connection tracks which would be detrimental during the final bonding of the component containing the infrared radiation detectors with the component containing the read-out circuits.

As shown in FIG. 1c the surfaces of the base substrate 100 and handling substrate 200 are contacted via the silicon oxide atoms of their respective oxide layers 140 and 210, implementing the so-called Van der Waals forces. One or more pressure points are provided on the wafer 200 to initiate a bonding wave (molecular adhesion wave). Advantageously, annealing in the 200-300° C. range is then performed for two hours to create covalent bonds to strengthen the bonding strength between the base substrate 100 and the handling substrate 200. Annealing may be performed or not in a gaseous atmosphere of the nitrogen (N2) or argon (Ar) type.

The steps shown in FIGS. 1a to 1c above make it possible to obtain heterogeneous substrates 100, 200 by direct bonding. The two substrates 100, 200 are then made joined together.

As shown in FIG. 1d the base substrate 100 is then thinned using the grinding technique, or "grinding", mentioned above down to a thickness 150 of less than or equal to 15 μm. Such thinning is a mechanical thinning executed with a fine grinding wheel (finishing wheel with a high porosity polymer binder, with a size of the diamond grains in a range of 2 to 4 μm). A chemical cleaning is performed to remove the particles remaining on the surface after grinding.

The thinned and cleaned base substrate 100 is then encapsulated in an encapsulation layer 230. The encapsulation is preferably performed so that the encapsulation layer 230 fully encapsulates the base substrate 100 except for one face of the base substrate 100 intended to be placed opposite the second component 400. This face is preferably intended to be covered with the layer 140, as shown in FIG. 1d.

The base substrate 100 associated with the encapsulation layer 230 forms an assembly of the detector circuit for detecting the infrared radiation also called the detection substrate or the first component. This first component includes other elements which will be mentioned later in the description.

The base substrate 100 provided with the encapsulation layer 230 may have a diameter, for example, of 2 inches, 3 inches, and may be round or square. The size of such a square substrate 100, 230 may be 37×38 mm or 47×48 mm.

The encapsulation layer 230 is preferably a silicon oxide layer (SiO2). It is advantageously produced as above by PECVD, from gaseous plasma of N2O/SiH4. The deposited thickness is less than 30 μm. In a preferred embodiment, a thickness 240 of 25 μm of SiO2 is deposited. The deposition is preferably performed at a low temperature, i.e. at a temperature below 300° C. Advantageously, this aims at minimizing the stress on the base substrate 100. As before, the method used for depositing oxide at a low temperature is so selected as to comply with the temperature limits of the photodiodes in the detection material and avoids the risk of present dopant species spreading therein. The oxide also has the following characteristics: compatibility with the steps of thinning by grinding ("grinding") and chemical mechanical polishing (CMP), a low mechanical stress, a low surface roughness after grinding and especially after CMP, a high deposition rate, a good operating overlay, i.e. there is good continuity of SiO2 above the periphery of the substrate 100.

It should be noted here that, in general, the mechanical stress caused by the various grinding operations used by the method of the invention will disappear by removing a thickness of 2 to 3 µm of the material hardened by grinding from the ground surface, by chemical mechanical polishing (CMP).

It should also be noted that the oxide layer 230 may be deposited using other techniques including those known as PVD and CVD and already mentioned, insofar as the method of deposition and the oxide obtained are compatible with the above constraints.

The assembly comprising the base substrate 100, the encapsulation layer 230 and the handling substrate 200 advantageously forms a plate having two opposite flat faces. It can thus be easily handled by the devices of the microelectronics industry.

The next step consists in flattening the deposited oxide layer 230. The flattening can be achieved using two different methods:

According to a first method, which is described in detail below in FIGS. 6a to 6f, a step of photolithography is performed to open, in a previously deposited resin layer, a central area corresponding to the base substrate 100 area (to be discussed). Then about 15 µm of SiO2 is etched if the thickness of SiO2 deposited is 25 µm using dry or wet etching. Then the resin is removed using plasma in a confined enclosure and/or by a wet operation, by performing a so-called "stripping" or pickling operation on said resin. The flattening of the oxide surface is formed by CMP to leave a thickness 241 from 1 to 3 µm on the central area 100 after CMP. The polished surface of SiO2 is then cleaned.

According to a second method, 25 µm thick oxide is mechanically thinned to a thickness of about 19 to 22 µm using two grinding sequences. First, a coarse grinding with a blank wheel using abrasive diamond grains having a size of about 40 µm. Then, a fine grinding with a finishing wheel using abrasive diamond grains having a size ranging from 2 to 4 µm. The flattening of the oxide surface by a CMP removes a thickness of 2 to 3 µm so as to leave, as above, a thickness 241 of 1 to 3 µm on the central zone 100. The polished surface of SiO2 is then cleaned under the same conditions as above.

Whatever the method used, an oxide layer of about 1 to 3 µm is left over the material forming the base substrate 100 so as to produce the metal interconnection tracks or to transfer a handle substrate, as can be seen hereunder.

In a top view (i.e. perpendicularly to the view of FIG. 1d) the first component formed by the encapsulated base substrate 100 has the shape desired for the detector to be prepared. The invention is not limited to any specific shape. It may typically be the shape of a disc having a desired diameter. It may also be the shape of a hexagon, a rectangle, a square or any other shape.

As shown in FIG. 1e, in order to be able to produce the metal interconnection tracks, a so-called "handling" substrate 300 is bonded to the base substrate 100 containing the IR radiation detector circuits. In the embodiment shown above, the handle substrate 300 is bonded to a free face of the encapsulation layer 230 i.e. the face opposite the face which is attached to the handling substrate 200. The handle substrate 300 may be selected for example among the following materials: germanium (Ge), glass, silicon (Si) and sapphire. Such bonding may be a direct bonding or use an organic adhesive.

In the case of a direct bonding the handle substrate 300 is separately prepared by depositing thereon a layer 310 of SiO2 about 500 nm thick by PECVD. The oxide surface is then processed by CMP to remove a thickness of about 250 nm. In general, the preparation of the handle substrate 300 is similar to what has been disclosed above for the handling substrate 200 in FIG. 1b. As in the previous case, the aim is to obtain, after polishing and cleaning, a flat hydrophilic oxide surface having a roughness preferably less than 10 or even 5 Å, and free of particulate contamination in order to improve the molecular adhesion via intermolecular bonds. Similarly, the surfaces are contacted through the atoms of silicon oxides and annealing is performed under the same conditions in order to enhance the strength of the bonding between the handle substrate 300 and the substrate comprising the encapsulation layer 230 encapsulating the base substrate 100.

In the case of an organic adhesive, a thermally and mechanically compliant organic adhesive is selected with the following technological steps of producing the interconnection tracks. Such steps include plasma etching, chemical cleaning, plasma deposition. A polyimide adhesive the glass transition temperature (TG) of which is greater than or equal to 250° C. will preferably be selected.

The assembly comprising the encapsulated base substrate 100 associated with the handling substrate 200 and the handle substrate 300 advantageously forms a plate.

In the next step, the result of which is shown in FIG. 1f, the multilayer assembly is thinned from the accessible face 202 of the handling substrate 200 secured to the base substrate 100 containing the IR radiation detector circuits, until the silicon oxide layer previously carried by the handling substrate 200 is reached. The stopping of the removal of the material forming the handling substrate 200 bears reference 232. Thus, the removal of the handling substrate 200 is advantageously performed so that the first component comprising the encapsulated base substrate 100 maintains the oxide layer 140 which had been deposited thereon and further maintains the oxide layer 210 which had been previously deposited on the handling substrate 200. The thinning is advantageously mechanically obtained by grinding, wet etching and CMP.

The metal interconnection tracks of the first component i.e. the metal interconnection tracks of the infrared radiation detector circuit are then produced. They will be in contact during the final bonding with the metal interconnection tracks of the second component 400 i.e. the interconnection tracks of the photodiodes read-out circuit.

The production of the metal interconnection tracks on the infrared radiation detector circuit side comprises the following steps, the results of which are shown in FIG. 1g:

During a first step of photolithography, alignment marks (not shown), so-called "dummies" tracks and the metal interconnection lines 160, which will be etched in the oxide layers 140 and 210 are defined in a standard manner in a resin layer (not shown). The "dummies" are dummy metal areas, made of copper (Cu) in this example, which are not used for the interconnections but will help ensure a better Cu/Cu bonding between the base substrate 100 containing the infrared radiation detector circuits and the read-out component 400 that will come into contact therewith during a subsequent stage of the direct bonding. In the conventional technique used for producing copper-based interconnections, a technique generally referred to by the term damascene (also called damascene method), copper lines will be inlaid in the oxide as explained below. The copper lines and pads are thus used not only for ensuring the passage of electric current but also participate in the Cu/Cu and Cu/SiO2 bonding between the first component 100, 230 containing the photodiodes and the second read-out component 400 during the phase of direct bonding. To obtain an optimum adhesion, it has been experimentally determined that the copper surface should occupy a fraction of not less than 18 percent and not more than 40 percent of the total bonding surface. The role of dummies more particularly consists in adjusting the copper surface involved in the bonding to optimize this operation.

The previous step of lithography is followed by a step of dry etching the lines and the dummies. About 500 nm of SiO2 is etched using plasma and then most of the protective resin is also removed using plasma. Then, a thorough cleaning of the end surface of SiO2 is carried out using a wet method in order to remove the residual resin.

The photolithography of the vias openings 170 i.e. the opening of the vertical interconnections between the layers which lead to the base substrate 100 is then carried out to reach the photodiodes 110. Like the interconnection lines, the vias, once filled with copper, will also participate in the bonding.

The dry etching of the vias can then be executed under the same conditions as above so that they lead to the material of the first substrate and then resin is removed. It should be noted here that the order in which the previous steps of photolithography (lines/dummies 160 and vias 170) can be reversed without inconvenience.

During the next step shown in FIG. 1h, a priming coat and a barrier layer are deposited using the conventional deposition techniques, i.e. PVD and/or CVD already mentioned. The priming coat is used as an adhesion layer. The main function of the barrier layer consists in preventing the diffusion of copper to the detector substrate 100. The deposited metals and the methods used must all comply with the temperature limits imposed by the embodiment of the photodiodes, which limit is as already seen below 300° C. A thin copper layer of about 300 nm is then deposited. It is typically deposited by PVD. Before depositing the thin copper layer usually referred to by the term "seed layer", i.e. priming layer, the underlying metal operating as a barrier is cleaned. Thereafter a thicker layer of copper of about 2 to 5 μm is electrolytically deposited. Copper is then annealed at 250° C., under a vacuum or not, to improve its adhesion. All these layers are represented by layer 180 in FIG. 1h.

The previous depositions are followed by a step of polishing before the direct bonding metal the result of which is shown in FIG. 1i. The face of the base substrate 100 whereon copper is deposited is polished by CMP. Polishing is stopped when the mixed Si02/Cu surface is reached and the desired result has been obtained, i.e. inlaying copper in all the areas 190 initially etched by photolithography (interconnections, dummies and vias) in the oxide layers 140 and 210 using the technique called damascene (also called damascene method). The polished surface is then wet cleaned with brushes or "scrubbers". A flat surface 192 with a low roughness of the order of 5 Å, free of particulate contamination, is thus obtained. Such conditions will make it possible, as already seen, to execute a direct bonding onto the substrate containing the read-out circuit and which has been prepared in a similar way as will be seen below.

The assembly shown in FIG. 1i and formed by the handle substrate 300 and the first component which comprises the base substrate 100 encapsulated and coated with a silicon oxide layer wherein interconnection tracks and preferably dummy copper areas are embedded, advantageously has a plate shape with two opposite flat faces. It can thus be easily handled by the devices of the microelectronics industry.

Preferably, the encapsulation layer 230 is directly in contact with the base substrate 100. The silicon oxide layer 140 partially forming the bonding layer is directly in contact with the base substrate 100. The photodiodes 110 are in contact with the silicon oxide layer 140 forming part the connection face 192.

In the detailed example above, the connection face 192 of the first component 100, 230 is carried on the one hand by a face of the base substrate 100 preferably coated with the layer 140 and on the other hand by a face of the encapsulation layer 230 which extends into the plane of the layer 140.

FIGS. 2a, 2b and 2c describe the preparation of the second component 400, i.e. the component containing the photodiodes 110 read-out circuits. This component 400 may also be referred to as the read-out substrate read-out circuit or read-out chip (ROIC, the acronym for Read-out Integrated Circuit). It is typically formed by a substrate of the same type as those produced by the microelectronics industry which mainly uses silicon for delivering all kinds of electronic integrated circuits. The invention makes no other assumption as regards the nature of the electronic read-out circuits which have been manufactured in the upper layers 402 of the second component 400. These will however and as already mentioned typically be CMOS circuits usually made from an advanced SOI substrate, the acronym for "silicon on insulator" substrate. The CMOS technology makes it possible to produce all kinds of high performance logic and analog circuits and thus read-out circuits suitable for the photodiodes which have been manufactured separately as described above in FIGS. 1a to 1i.

FIGS. 2a, 2b and 2c more particularly show the final operations for the production of the component 400 containing the read-out circuits and for preparing the surface for bonding. During these operations at least two layers of metal connections that will enable the electric interconnection between the photodiodes and the read-out circuits provided on this read-out component 400 are generally produced. These are represented by the assembly of layers 402 comprising buried metal tracks 494 for contact recovery. FIGS. 2a to 2c illustrate the operations which will enable the bonding and the interconnection of the component with the detection component 100 containing the photodiodes 110.

To achieve the interconnection layers shown in the examples of FIG. 2b, wherein a first level metal 410 is shown, and FIG. 2c, wherein a second metal level 420 is shown, the materials and techniques used are preferably similar to or identical with those used for producing the first component containing the infrared radiation detection photodiodes 110. Consequently, to form the successive layers of silicon oxide, the previously mentioned CVD and PVD, preferably PECVD techniques, can be used, with such techniques making it possible to produce a deposited layer having a high density. Furthermore, for the interconnections themselves, the metal used is copper and the technology is damascene (also called damascene method). This technique consists, as seen in FIGS. 1g to 1i, in inlaying copper in all the previously etched zones in silicon oxide layers. A first oxide layer 405 is for example shown in FIG. 2a from which a first level of interconnections 410 will be produced followed by a second level of interconnections 420. FIGS. 2a to 2c are only representative examples of the implementation of the invention. In particular, more than two levels of interconnections may of course be produced.

The methods, materials and means used to achieve the interconnections are potentially those that have been developed by the microelectronics industry. An exemplary implementation is already described in FIGS. 1g to 1i. The persons skilled in the art will appreciate that many alternative implementations can be applied without departing from the spirit of the invention.

As regards this last point, it should be noted in particular that the step of annealing will preferably be executed in a vacuum with three stages in a temperature range from 150° C. to 400° C., with the read-out component 400 being able to support, at this stage without any disadvantage, higher temperatures than those of the photodiodes which is limited to 300° C. as already mentioned.

Similarly, the vertical interconnections, the vias may be etched done by providing for an etching barrier layer (not shown) typically made of silicon nitride (SiN) which is preferably deposited by PECVD in a typical thickness of 40 nm.

It should be noted here that the method for producing copper interconnections completed by a chemical mechanical polishing (CMP) on each layer makes it possible to obtain a perfectly flat surface 492 which can easily meet the criteria for direct bonding already mentioned, i.e. a low roughness of less than 10 Å and preferably of the order of 5 Å and a surface free of particulate contamination after cleaning. The techniques of successive vacuum depositions of layers of the CVD and PVD types make it possible to produce dense materials, which contributes to the achievement of this low roughness after CMP.

Specifically and without limitation, the front face of the read-out substrate is polished by CMP. Polishing stops when the mixed SiO2/Cu surface is reached. The polished surface is then cleaned with a scrubber i.e. a wet cleaning by the action of brushes.

As shown in FIG. 2c, the metal areas 490 on the surface of the read-out component 400 generally include alignment marks (not shown), so-called "dummies" pads, metal interconnection lines and vias which have all been delineated by photolithography of the oxide layers to match and adapt to the corresponding areas 190 of the base substrate 100. All these areas will also be involved in producing a better adhesion during the direct bonding of the two substrates formed by the detection 100, 230 and read-out components 400 as described hereunder.

FIGS. 3a to 3c describe the steps of assembling the two components, the one containing the photodiodes and the one containing the read-out circuits, by direct bonding.

As mentioned above, each of these two components advantageously forms a plate having two opposite flat faces, which makes their handling easy.

The detection component thus has a face 192, called the connection face. The connection face 192 is formed by at least one silicon oxide-based layer 140 to 210 wherein the interconnection tracks and preferably dummy copper areas are formed.

The read-out component 400 also has a connection face 492. The connection face 492 is also formed by a silicon oxide layer and carries interconnection tracks and preferably dummy copper areas.

As described above, the connection faces 192 and 492 have been polished and cleaned in order to preserve the surface quality as regards chemical and particulate contaminations. They are then brought into contact. The surface quality of the components is such that the molecular adhesion is created between these thanks to the Van der Waals attraction forces that are exerted at distances of less than a few nanometers. This bonding is carried out using equipment that can ensure the alignment between the two components prior to the contacting thereof with the alignment pattern specific of direct bonding.

As the connection faces 192 and 492 are directly in contact with each other, the operation of bonding the detection and read-out components may be called the "direct bonding".

To obtain this result one or more pressure points are exerted on one or the other component to initiate a bonding wave. Preferably, the application of the bonding wave comprises applying one or more localized pressure points on a surface of less than a few mm².

As already mentioned in the description of the previous bonding operations, annealing at a temperature below 300° C. is carried out for two hours, with or without controlled atmosphere to create covalent bonds in order to enhance the bond strength. It should be noted again that it is important for the annealing to be executed at a temperature below this value to avoid the risk of the photodiodes 110 dopant species spreading into the detector material.

As shown in FIG. 3b the handle substrate 300 is then thinned by grinding to leave approximately 50 μm of this substrate, and then by wet etching until the silicon oxide (SiO2) of the encapsulation layer 230 is reached.

Then, as shown in FIG. 3c, the encapsulation layer 230 (SiO2) is chemically and/or mechanically etched by grinding. As mentioned above, a step of CMP makes it possible to remove the hardened surface by grinding until the mixed surface 194 made, on the periphery, of the SiO2 of the encapsulation layer 230 and, in the centre, of the material used to produce the base substrate 100, typically indium antimonide (InSb) or any other material for infrared cited above, is exposed. The polished mixed surface 194 is then cleaned to expose the detection material, indium antimonide, in this example.

The assembly formed by the first detection component, the second read-out component and the interconnection tracks thereof thus forms a plate having two opposite flat faces.

Figure 4B:
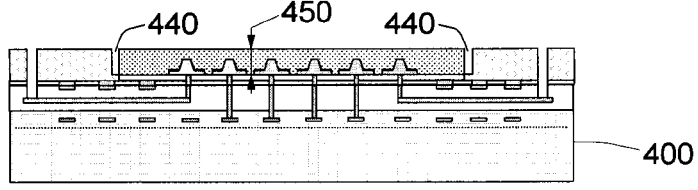

FIGS. 4a and 4b illustrate further steps of the method of the invention that are performed after the two detection and reading components have been assembled as described in the preceding figures.

The opening 440 makes it possible to secure the initial assembling on the wafer during the steps of annealing or cooling down. The lateral displacement of the detector substrate is facilitated by the opening 440.

During a first step, as shown in FIG. 4a, openings 430, which show test pads, are formed on the periphery to test the electric continuity of the photodiodes according to the temperature. During this step a photolithography, which defines the openings 430, and then a dry etching of silicon oxide (SiO2) in such openings and finally the removing of the resin deposited beforehand and used to define the openings 430 are conventionally carried out.

In a second step, as shown in FIG. 4b, the periphery 440 of the base substrate 100 containing the infrared photodiodes is cleared so that the base substrate 100 can expand or compress in operation and during temperature electric tests, from the room temperature up to 77° K and vice versa. As discussed in the introductory section on the prior art, the type of device considered by the invention is so designed as to operate at low temperature, for example 77° K, which is the temperature of liquid nitrogen, in order to reduce the background noise of the detector and thus to significantly increase the detection range of the infrared radiation that can be measured. The base substrate 100 is cleared using photolithography, etching and resin removal operations similar to those described above for FIG. 4a. This addresses the problem caused by the very different expansion of materials that the two components 100 and 400 are made of. The invention solves the problem described in the section on the state of the art by sufficiently refining 450 the detecting component (100, 230) and by clearing the periphery 440 thereof, so that it can conveniently follow the expansion of the read-out component 400. The latter is generally made of silicon, a material for which it has been said that the CTE was much lower than that of the composite semiconductor materials used for the base substrate 100 containing the photodiodes. It should be noted that the latter is for example made of one of III-V, II-VI or IV-VI materials, already mentioned. These steps make it possible to test the resistance to thermal cycling of the set.

It should be noted that these two steps are optional. Furthermore, they may be implemented independently of each other. The second step of clearing the base substrate 100 can thus perfectly be performed without making the test pads.

Figure 5A:
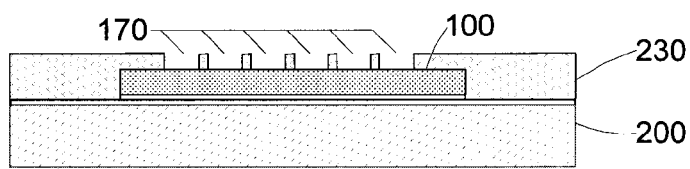
FIGS. 5a to 5c disclose another exemplary production of the first component, an example wherein the photodiodes are formed after assembling the base substrate on a handling substrate.
Figure 5B:
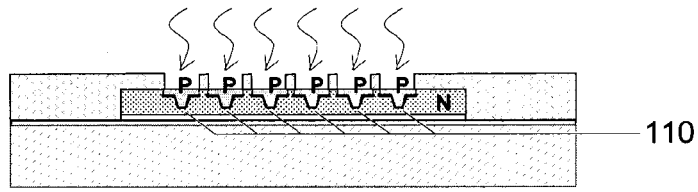
Figure 5C:
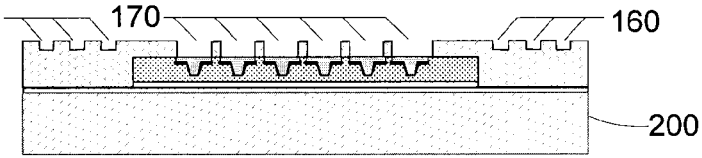

FIGS. 5a to 5c describe an alternative embodiment of the method for producing the detection component containing the infrared radiation detectors i.e. the photodiodes 110. In this alternative implementation of the method previously described in FIGS. 1a to 1i, the photodiodes 110 are not initially made in the base substrate 100 but only after the step corresponding to FIG. 1 as explained hereinafter, i.e. after bonding the base substrate 100 on the handling substrate 200 and after the encapsulation 230. The initial steps are the same and are performed under the same conditions as described in FIGS. 1a to 1d.

It should be noted, however, that the absence of the photodiodes to this point provides a greater flexibility for choosing the production options. The persons skilled in the art will be able to adapt the method described above in order to best take advantage of the absence of photodiodes at this stage of the production of infrared detectors according to the invention. The annealing may specifically be performed at a higher temperature not exceeding the melting temperature of the detector material since the dopant species in the photodiodes have not been implanted yet.

As before, the photodiodes can be PN or PIN junctions and are formed by ion implantation. The production thereof, after the encapsulation comprises the steps of:

A step of photolithography of openings 170, referred to as vias is performed first. The vias may have different diameters, for example 5 μm and 8 μm. For this purpose, a positive photosensitive resin having a thickness of less than 10 m is spread. In a preferred implementation a 5 μm thick positive resin is spread. The conventional photolithography technique is applied. The patterns of the vias are exposed through a mask and developed. The resin is then cured at about 110° C.

FIG. 5a shows the result of etching the encapsulation layer 230, typically made of SiO2. To reach this result the photolithography of vias having variable diameters (for example 5 μm and 8 μm) is performed. For this purpose, a photosensitive resin is spread. Then a conventional photolithography technique is applied. The patterns of the openings 170 (vias) are developed and exposed through a mask. The resin is then cured. About 1 to 3 μm of the encapsulation layer 230 are then plasma etched to reach the material forming the base substrate 100. The major part of the resin is then removed using plasma, and then the surface of the encapsulation layer 230 is thoroughly wet cleaned in order to remove the residues of resin.

FIG. 5b illustrates the step of ion implantation of photosensitive diodes 110 where the openings 170 have been provided. During this operation an ion implantation of positive ions is performed if the material forming the base substrate 100 is N doped, as shown. If the material is P doped negative ions will be implanted instead. In both cases a PN junction is formed. Among the dopant elements of InSb, cadmium (Cd), tin (Sn) and tellurium (Te) for example may be used.

FIG. 5c shows the results of the steps of photolithography and etching the oxide of layer 230 in the so-called "dummies" areas 160 described above, and after removal of the resin. Resin photolithography, etching and cleaning are identical to what has been described above.

At this stage of the alternative method for producing the detection component all the etched areas 160 and 170 are obtained which define the metal interconnections, the vias and the "dummies". All the copper inlaying or damascene operations which have already been described in FIGS. 1g to 1i can thus be executed. The final surface condition is thus the same as 192 in FIG. 1i and is suitable for direct bonding on the component 400 containing the read-out circuits.

It should be noted that in this alternative method, the specific steps of which are illustrated in FIGS. 5a to 5c described above are not used to transfer the component 100, 230 containing the photodiodes on the handle substrate 300. The steps corresponding to FIGS. 5a to 5c are thus substituted for the operations corresponding to FIGS. 1f and 1g.

FIGS. 6a to 6f describe another alternative method wherein a housing 250 is provided in the handling substrate 200 for receiving the base substrate 100. The assembly thus formed is then used to reconstruct a wafer, typically with a diameter of 200 mm, which will then be compatible with the current standard production lines of integrated circuits particularly those of the CMOS technology.

As shown in FIG. 6a, the operations start, as previously from a base substrate 100 made of a semi-conductive composite material, as described in FIG. 1. This alternative method is additionally identical to the one disclosed in FIGS. 5a to 5c, i.e. the photodiodes are made only after the base substrate 100 has been assembled onto a handling substrate 200.

The base substrate 100 is prepared under the same conditions as those described above. In particular a layer of oxide 140 is created on the surface for the bonding. As shown in FIG. 6b, in this alternative method, a receiving housing 250 is prepared in the handling substrate 200 so as to receive the base substrate 100 wherein the infrared radiation detecting photodiodes which will be formed. The receiving housing 250 has a diameter typically ranging from 2 inches to 200 mm for a depth of about 15 μm. This receiving housing is created either by mechanical machining or by dry etching in plasma, or by wet etching. The size of the receiving housing is set according to the size of the base substrate 100.

The handling substrate 200 also has all the characteristics described in FIG. 1b. In particular, the surface condition obtained and the means for obtaining this surface condition are those already described in order to enable the direct bonding of the two substrates as shown in FIG. 6c.

As already described in FIG. 1, the next step consists in thinning the base substrate 100 to reduce it to a thickness 150 of less than or equal to 15 μm. As shown in FIG. 6d, the base substrate 100 is then at the same level as the handling substrate 200. More specifically, the base substrate 100 includes a free face opposite a face through which it is attached to the handling substrate 200. The handling substrate 200 comprises a receiving surface intended to receive the base substrate 100. This receiving face defines a plane outside the receiving housing 250. After having been thinned, the free face of the base substrate 100 is contained in such plane. The base substrate 100 thus does not protrude beyond the receiving face of the handling substrate 200.

The thinned base substrate 100 is then encapsulated, typically in a silicon oxide layer 230, under the same conditions as has been described above in FIG. 1*d*. The result of this operation is shown in FIG. 6*e*.

The encapsulation layer 230 is then in turn thinned and flattened using all the grinding, chemical mechanical polishing and cleaning techniques described above. As shown in FIG. 6*f* a thickness 241 of the encapsulation layer 230, for example of about 1 μm, is left above the thinned base substrate 100.

The assembly formed by the handling substrate 200 and the detecting component 100, 230 forms a plate having two opposing flat faces. It can thus be easily handled.

At this stage, the result corresponds to what has been obtained in FIG. 1*d*. As the photodiodes have not been previously formed either in this alternative method, the alternative method previously described in FIGS. 5*a* to 5*c* is then applied to finally assemble the base substrate 100 containing the infrared radiation detectors and the one containing the read-out circuits 400.

FIGS. 7*a* to 7*d* show that the method also applies when several infrared detector base substrates 100 of smaller sizes are provided, which will be assembled on the same handling substrate 200 in order to adapt it to the format of the production line wherein they should be processed. The individual substrates 100 may come from various technologies and be of different sizes. In particular, the materials that compose these may be different composite semi-conductive materials. The assembling operations are the same as those described above. All the alternative methods described may be applied. In particular, the photodiodes may have been manufactured before or after the assembling as described in the alternative method illustrated in FIGS. 5*a* to 5*c*.

FIG. 7*a* shows an example of three individual base substrates 100 the semi-conductive materials of which are different and which are assembled together on the same handling substrate 200. In this example, the photodiodes have already been produced in the base substrate 100. The method applied is the one described in FIGS. 1*a* to 1*i*. As shown in FIGS. 7*b* and 7*c*, and similarly to what has been described in the corresponding FIGS. 1*a* to 1*i*, the base substrates 100 will be assembled by direct bonding on the handling substrate 200. Then, after thinning the base substrates 100, these are encapsulated 230 as shown in FIG. 7*d*.

The other operations making it possible to finally obtain the assembling on the read-out component 400 are similar to those already described.

It should be noted here that the base substrates 100 may each be a sensor chip having been cut from a plate whereon it has been manufactured prior to being assembled on the handling substrate.

The methods according to the embodiments described above thus make it possible to assemble two substrates by direct bonding.

The steps of direct bonding according to particular embodiments have been described in detail while referring to FIGS. 1 to 7*d*. The main steps leading to the direct bonding are summarized below:

1. Producing, on each connection face, a SiOx layer dense enough to accept a CMP adapted to reduce the roughness to a value of less than or equal to 1 nm. This layer is obtained by vacuum deposition techniques, such as for example the following techniques: CVD, PVD, preferably PECVD.
2. Preparing the connection faces by a CMP adapted to reduce the roughness. These connection faces have only either SiOx, or SiOx and copper inlay areas.
3. Alignment of the two components to position the connection faces thereof opposite each other and make the copper inlay areas thereof, if any, match.
4. Contacting the connection faces. Such contacting is advantageously performed at room temperature. Advantageously, said contacting is performed without exerting a global pressure force
5. Direct bonding, using Van der Waals forces. For this purpose, a localized pressure is preferably applied at one or more points. The localized pressure is applied to a surface, typically of less than a few mm2, for example a few tens or hundreds of μm2, of one of the components, so as to generate a bonding wave, meaning Van der Waals.
6. In order to enhance adherence, thermal annealing is preferably carried out. This annealing is carried out at a temperature below 300° C. to avoid degrading the photodiodes.

In summary, the method of the invention allows not only to assemble two components together but also several base substrates comprising infrared photodiodes on the same handling substrate or even individual chips cut from one or more detection substrates. The advantage in this case being that detection chips having been tested and which are deemed to be fully functional only are assembled, which makes it possible to increase the manufacturing yield of infrared radiation detectors produced according to the method of the invention.

The method of the invention also provides the following advantages:

The technology of assembling hybrid chips by direct bonding according to the invention makes it possible to eliminate the steps related to the currently used indium metal technology. This makes it possible to eliminate: the deposits of indium; the steps of remelting; the soldering fluxes; the defective flatness that frequently appears on the components (unevenness); the steps of cleaning the flux residues, the steps of coating which generate defective reliability due to inclusion of bubbles confined in the interconnection area and excess glue to be removed (such as coating beads); hybridisation problems due to the different expansion of the substrates; the defective reliability due to-gold-indium (Au—In) intermetallic areas.

In the present technique, the coating material used can not fully play its part because it can not be cross-linked at a temperature which gives it its thermo-mechanical consistency. As a matter of fact, in order to protect the photodiodes and to accommodate the significant differences between the coefficients of thermal expansion (CTE) of heterogeneous substrates, this cross-linking is executed at a temperature which is 40° C. lower than the one recommended by the manufacturer. The invention makes it possible to overcome this problem.

The progress made today in the field of intra-connections (lower repetition pitch, reduction in the minimum diameter) make it possible to accommodate always smaller pixel pitches that become less than or equal to 15 μm. The method of the invention, which can potentially take advantage of all the technological advances in the silicon microelectronics industry unlike the current hybridization techniques, can easily be adapted to such reduction in the pitch of duplication of pixels. The hybridization based on the use of indium balls reaches its limits, especially because of the unevenness it entails. The cleaning and coating of components having pitches of less than 15 μm thus become extremely difficult or even impossible when the size of the component exceeds a few square centimeters. The large size matrices are thus extremely difficult to achieve with the die based on the use of indium balls matrices. The volume of indium decreases with the reduction in the pitch, which makes hybridization very difficult since it is no longer possible to compensate the unevenness of the components.

A major contribution of the invention is the use of methods which take full advantage of the constant development of microelectronics with a gain in terms of shorter cycle times, improved performance and reliability of the assembly which provides both technical and economic advantages.

The possibility of transferring heterogeneous materials onto a handling substrate compatible in size with a 200 mm or 300 mm microelectronics environment and the technique of encapsulating the radiation detector material technology are very advantageous characteristics of the invention.

As regards hybridization, the technique of the invention is independent of the nature of the radiation detection substrate provided the maximum temperature authorized for the photodiodes is complied with.

The invention claimed is:

1. A method for producing at least one photosensitive infrared detector by assembling a first electronic component including a plurality of photodiodes sensitive to infrared radiation and a second electronic component including at least one electronic read-out circuit of the plurality of photodiodes, the method comprising:
    production, on each one of the first and second components, of a connection face formed at least partially by a silicon oxide (SiOx)-based layer, with x ranged between 1 and 2; the production of the connection faces comprising:
        vacuum deposition of a silicon oxide (SiOx)-based layer, with x ranged between 1 and 2;
        a chemical mechanical polishing (CMP) of the deposited layer, carried out to bring the root mean square height (RMS) to a value lower than or equal to 1 nm;
    bonding the first component and the second component by the connection faces thereof, thereby performing direct bonding of the two components.

2. A method according to claim 1, wherein a direct bonding annealing is carried out at a temperature below 300° C.

3. A method according to claim 1, wherein the bonding comprises application of a bonding wave.

4. A method according to claim 3, wherein the application of the bonding wave comprises application of one or more localized pressure points.

5. A method according to claim 4, wherein the application of the bonding wave comprises applying one or more localized pressure points on a surface smaller than 5 mm².

6. A method according to claim 1, wherein the bonding comprises contacting the connection faces at room temperature.

7. A method according to claim 1, wherein the direct bonding of the two components is provided by Van der Waals forces.

8. A method according to claim 1, wherein the vacuum deposition to obtain a connection face for the first component is performed by physical vapor deposition (PVD), or by chemical vapor deposition (CVD), or by plasma enhanced chemical vapor deposition (PECVD).

9. A method according to claim 1, wherein the vacuum deposition to obtain a connection face for the second component is performed by physical vapor deposition (PVD), or by chemical vapor deposition (CVD), or by plasma enhanced chemical vapor deposition (PECVD).

10. A method according to claim 8, wherein the vacuum deposition is performed at a temperature below 300° C.

11. A method according to claim 1, wherein the production of a connection face for the first component and a connection face for the second component comprises forming on such connection faces, copper (Cu) inlay zones arranged to match when such connection faces are positioned opposite each other, and wherein the copper inlay areas occupy a surface area between 18% and 40% of the surface of the connection face, for at least one of the connection faces.

12. A method according to claim 11, wherein producing the connection face on the first component is performed so that the silicon oxide-based layer covers an entirety of the connection face except for the copper inlay areas and tracks and/or electric interconnection vias.

13. A method according to claim 1, further comprising thinning the first component so that a thickness thereof is smaller than about 35 times or more the thickness of the second component.

14. A method according to claim 1, further comprising preparing the first component comprising:
    production of at least one base substrate integrating or configured to integrate the plurality of photodiodes,
    encapsulation of the at least one base substrate in an encapsulation layer, with the encapsulation being performed so that the encapsulation layer completely covers the at least one base substrate except for one face of the at least one base substrate configured to be placed opposite the second component,
    wherein the at least one base substrate has a coefficient of thermal expansion (CTE) between 4 and 8 ppm/° C. or between 5 and 7 ppm/° C., and wherein the second component comprises a substrate carrying the electronic read-out circuit and having a coefficient of thermal expansion (CTE) between 1.5 and 4 ppm/° C. or between 2.5 and 3.5 ppm/° C.

15. A method according to claim 1, further comprising preparing the first component, comprising:
    production of at least one base substrate integrating or configured to integrate the plurality of photodiodes,
    encapsulation of the at least one base substrate in an encapsulation layer, so that a main dimension of the first component comprising the at least one base substrate and the encapsulation layer is greater than a main dimension of the at least one base substrate, with the main dimensions being a maximum dimensions taken along directions contained in planes parallel to the connection faces, with the encapsulation being performed so that the encapsulation layer completely covers the at least one base substrate except for one face of the at least one base substrate configured to be placed opposite the second component.

16. A method according to claim 15, wherein the first and second components form plates, wherein the main dimension of the first component is approximately equal to the main dimension of the second component, and wherein the main dimensions are diameters or diagonals of the plates.

17. A method according to claim 15, wherein the encapsulation layer is a silicon oxide SiOx-based layer, with x ranged between 1 and 2.

18. A method according to claim 14, wherein prior to the encapsulation of the at least one base substrate in the encapsulation layer, further comprising fixing the at least one base substrate performed on a handling substrate.

19. A method according to claim 18, wherein, prior to the fixing the at least one base substrate on a handling substrate, further comprising producing a silicon oxide-based layer on at least a portion of a face of the handling substrate, and wherein the fixing the at least one base substrate on the handling substrate is performed by direct bonding of the silicon oxide SiOx-based layers thereof.

20. A method according to claim 18, wherein the handling substrate includes a receiving housing, and wherein the at least one base substrate is fixed in the receiving housing during the fixing.

21. A method according to claim 15, wherein the plurality of photodiodes is integrated into the at least one base substrate prior to the encapsulation of the at least one base substrate in the encapsulation layer.

22. A method according to claim 18, wherein after fixing the at least one base substrate on the handling substrate and after encapsulation, a free face of the encapsulation layer is fixed to a handle substrate, then the handling substrate is at least partially removed.

23. A method according to claim 22, wherein the removal of the handling substrate is performed so that the first component maintains a silicon oxide-based layer deposited on the at least one base substrate prior to the fixing thereof to the handling substrate, and maintains a silicon oxide SiOx-based layer carried by the handling substrate prior to the fixing.

24. A method according to claim 22, wherein, prior to the fixing the encapsulation layer on the handle substrate, further comprising producing a fixing layer on at least a portion of a face of the handle substrate, and wherein the fixing the encapsulation layer on the handle substrate is performed by direct bonding of the fixing layer of the handle substrate on a free-remaining face of the encapsulation layer.

25. A method according to claim 21, wherein the first component comprises a plurality of base substrates, and wherein the preparing the first component comprises encapsulating the plurality of base substrates in the same encapsulation layer.

26. A method according to claim 15, wherein the plurality of photodiodes is integrated into the at least one base substrate after the encapsulation of the at least one base substrate in the encapsulation layer.

27. A method according to claim 26, wherein the encapsulation of the at least one base substrate is performed so that the encapsulation layer covers at least one face of the base substrate, wherein at least one access to the face of the at least one base substrate which is covered by the encapsulation layer is subsequently performed through the encapsulation layer, and wherein the photodiodes are obtained by ion implantation of dopants through the at least one access.

28. A method according to claim 15, wherein at least one space is created between a periphery of the at least one base substrate and the encapsulation layer.

29. A method according to claim 1, wherein the bonding the first component and the second component forms a plurality of photosensitive infrared detectors which each comprise at least one photodiode and a read-out circuit, and wherein a cutting is performed after the bonding the first and the second components for separating the photosensitive infrared detectors from one another.

* * * * *